(12) United States Patent
Kurisu et al.

(10) Patent No.: US 6,838,948 B2
(45) Date of Patent: Jan. 4, 2005

(54) OSCILLATION APPARATUS AND COMMUNICATION APPARATUS USING THE SAME

(75) Inventors: Toru Kurisu, Omihachiman (JP); Hirotsugu Abe, Omihachiman (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 10/608,148

(22) Filed: Jun. 30, 2003

(65) Prior Publication Data

US 2004/0008089 A1 Jan. 15, 2004

(30) Foreign Application Priority Data

Jul. 10, 2002 (JP) ........................................ 2002-201286

(51) Int. Cl.$^7$ ................................................ H03B 5/18
(52) U.S. Cl. ........................ 331/46; 331/96; 333/219.1
(58) Field of Search ............................ 331/46, 96, 99, 331/107 DP, 117 D, 107 SL; 333/219.1, 202

(56) References Cited

U.S. PATENT DOCUMENTS

| | | | |
|---|---|---|---|
| 4,763,084 A | * 8/1988 | Pavio et al. .................. 331/56 |
| 5,652,556 A | 7/1997 | Flory et al. | |
| 5,834,981 A | * 11/1998 | Trier et al. .................... 331/99 |
| 6,297,707 B1 | * 10/2001 | Martheli et al. .............. 331/96 |
| 6,529,094 B1 | * 3/2003 | Kubo et al. .................. 333/134 |

FOREIGN PATENT DOCUMENTS

JP 4335703 11/1992

OTHER PUBLICATIONS

UK Search Report dated Nov. 7, 2003.

* cited by examiner

Primary Examiner—Robert Pascal
Assistant Examiner—Joseph Chang
(74) Attorney, Agent, or Firm—Dickstein, Shapiro, Morin & Oshinsky, LLP.

(57) ABSTRACT

An oscillation apparatus has a multi-mode dielectric resonant element; a plurality of oscillation circuits, each including a line coupled to the dielectric resonant element and active devices connected to ends of the line; and a substrate having the lines and the active devices provided thereon. The dielectric resonant element is placed on the substrate. The magnetic fields, occurring in the dielectric resonant element, in a plurality of resonant modes having different resonant frequencies are coupled to the corresponding lines in the plurality of oscillation circuits.

14 Claims, 12 Drawing Sheets

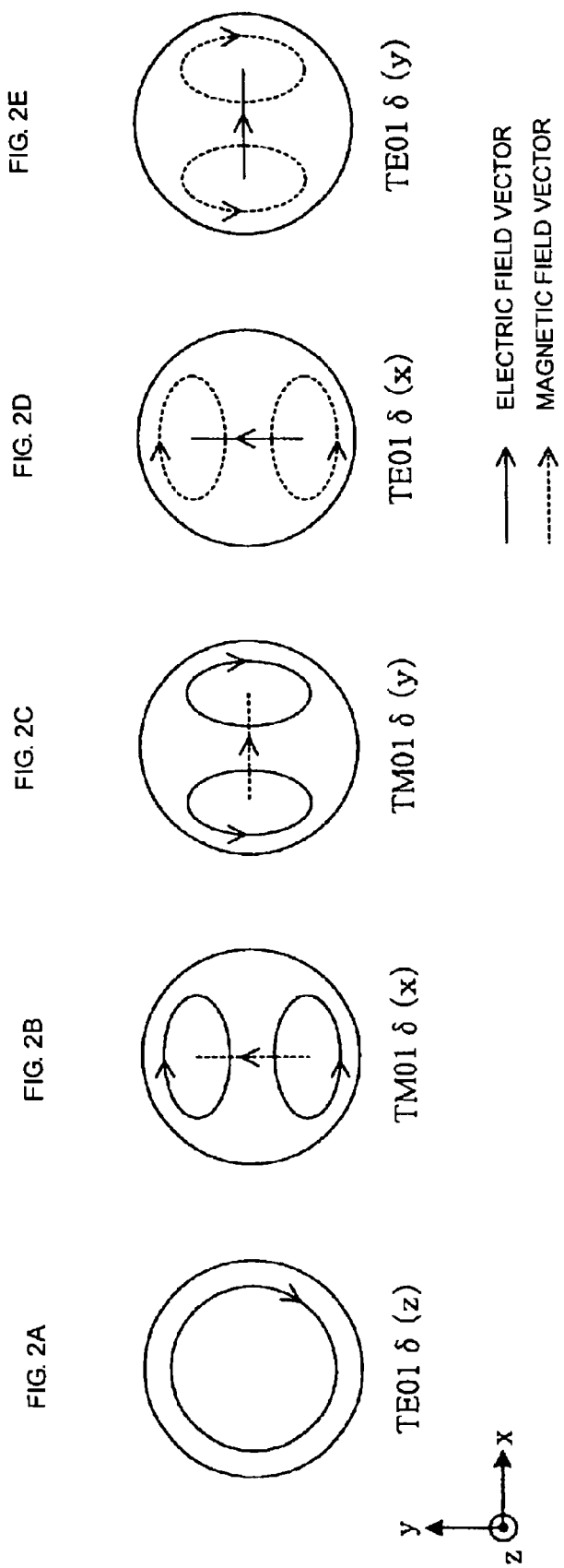

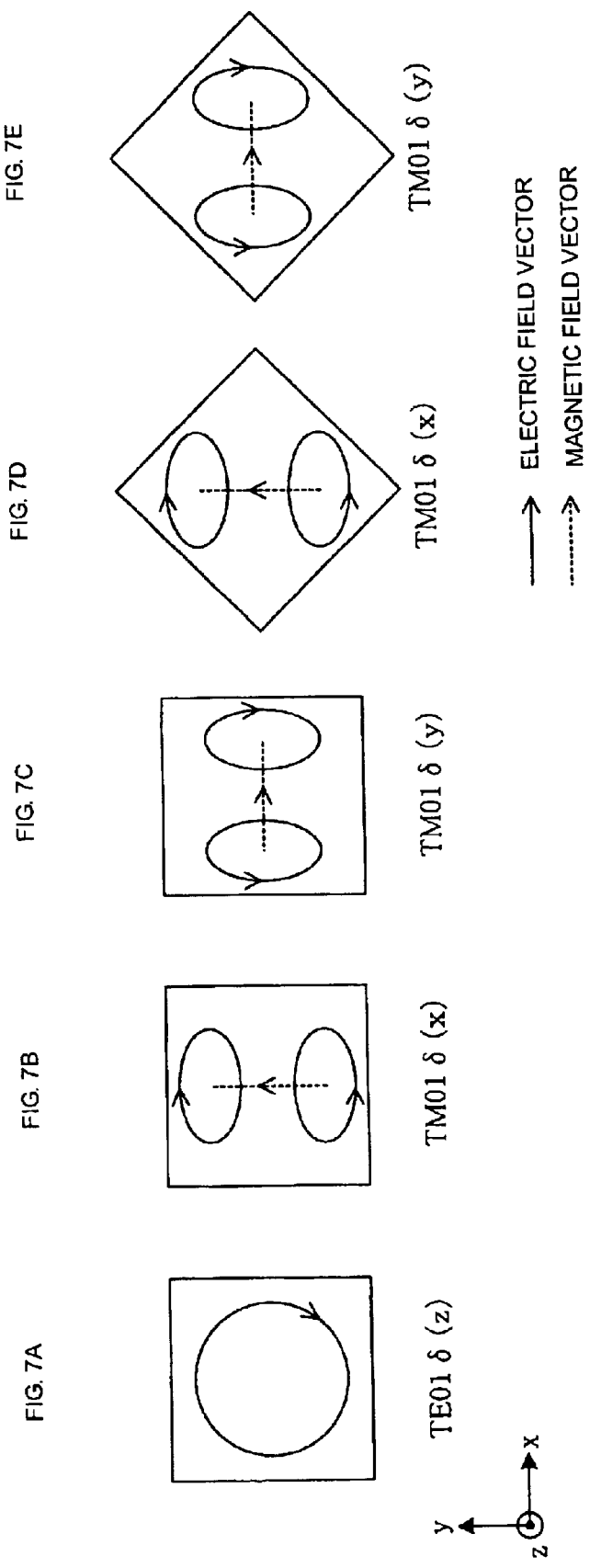

OSCILLATION APPARATUS AND COMMUNICATION APPARATUS USING THE SAME

BACKGROUND OF THE INVENTION

1. Field of the Invention

The present invention relates to an oscillation apparatus including a dielectric resonant element and to a communication apparatus using the oscillation apparatus.

2. Description of the Related Art

Heretofore, low-loss dielectric filters having improved frequency selectivity have been desired for effective use of frequency. In order to realize such characteristics, dielectric resonant elements having a high unloaded Q factor (hereinafter, simply referred to as "Qu") are used.

The dielectric resonant elements included in oscillators are ones having a high Qu in order to reduce noise and stabilize the temperature characteristic.

Dielectric resonant elements using a TE01δ mode are effective as the dielectric resonant elements having a high Qu. An oscillator using the dielectric resonant element in the TE01δ mode is disclosed in Japanese Unexamined Patent Application Publication No. 2000-323923.

An oscillator that receives signals from broadcasting satellites (BSs) and signals from communications satellites (CSs) with a single converter is disclosed in Japanese Unexamined Patent Application Publication No. 09-162646. In order to receive two kinds of signals within different frequency bands, two local oscillators corresponding to the frequency bands are required. For example, the local oscillation frequency for BS broadcasting is 10.678 GHz and the local oscillation frequency for CS broadcasting is 11.200 GHz. Heretofore, one TE01δ single-mode resonator for the corresponding frequency has been used for every local oscillator; namely, two TE01δ single-mode resonators have been used.

Receiving two kinds of signals having different frequencies with a single converter can realize compact and low-cost receivers to some extent. However, since two separate oscillators are provided in the converter, it is impossible to drastically reduce the size and cost of the converter.

SUMMARY OF THE INVENTION

It is an object of the present invention to provide a compact and low-cost oscillation apparatus for outputting multiple kinds of oscillation signals having different frequencies and to provide a communication apparatus using the oscillation apparatus.

The present invention provides, in a first aspect, an oscillation apparatus having a multi-mode dielectric resonant element; a plurality of oscillation circuits, each including a line coupled to the dielectric resonant element and active devices connected to ends of the line; and a substrate having the lines and the active devices provided thereon. The dielectric resonant element is placed on the substrate. The magnetic fields, occurring in the dielectric resonant element, in a plurality of resonant modes having different resonant frequencies are coupled to the corresponding lines in the plurality of oscillation circuits.

With this structure, a plurality of oscillators having different oscillation frequencies can be included in the oscillation apparatus with a single dielectric resonant element, thus realizing a compact and light-weight oscillation apparatus.

A plurality of oscillation circuits in the oscillation apparatus may be two oscillation circuits. It is preferable that a line that is coupled to the dielectric resonant element of one oscillation circuit be placed substantially in parallel to a line that is coupled to the dielectric resonant element of the other oscillation circuit. The multi-mode dielectric resonant element is preferably placed between the line of one oscillation circuit and the line of the other oscillation circuit. The magnetic fields in two resonant modes of the dielectric resonant element are preferably coupled to the corresponding lines.

With this structure, since the two oscillation circuits are placed symmetrically with respect to a point where the dielectric resonant element is mounted, the dielectric resonant element is easily placed on the substrate having the oscillation circuits provided thereon.

The two resonant modes of the dielectric resonant element may be a TM01δ mode and a TE01δ mode.

In such a case, the magnetic fields in the two resonant modes having different resonant frequencies are magnetically coupled to the lines on the substrate with ease.

The dielectric resonant element may be a substantially circular dielectric plate or may be a substantially square dielectric plate.

With this structure, the dielectric resonant element can be easily produced, thus reducing the cost of the oscillation apparatus.

The present invention provides, in a second aspect, a communication apparatus using the oscillation apparatus. This enables a compact and light-weight communication apparatus to be produced at a low cost.

BRIEF DESCRIPTION OF THE DRAWINGS

FIGS. 2A to 2E show examples of the electric and magnetic field vectors in each resonant mode occurring in a dielectric resonant element of the dielectric resonator in FIGS. 1A to 1C;

FIGS. 7A to 7E show examples of the electric and magnetic field vectors in each resonant mode occurring in a dielectric resonant element of the dielectric resonator in FIGS. 6A to 6C;

DESCRIPTION OF THE PREFERRED EMBODIMENTS

The structure of a dielectric resonant element used in an oscillation apparatus according to a first embodiment of the present invention will now be described with reference to FIGS. 1A to 5D.

Figure 1A:
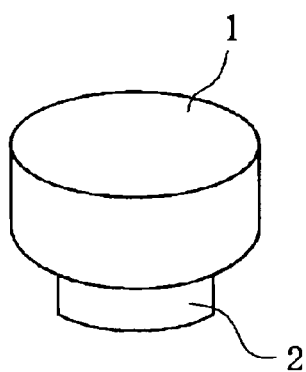
FIG. 1A is a perspective view of a dielectric resonator used in an oscillation apparatus according to a first embodiment of the present invention.
Figure 1B:
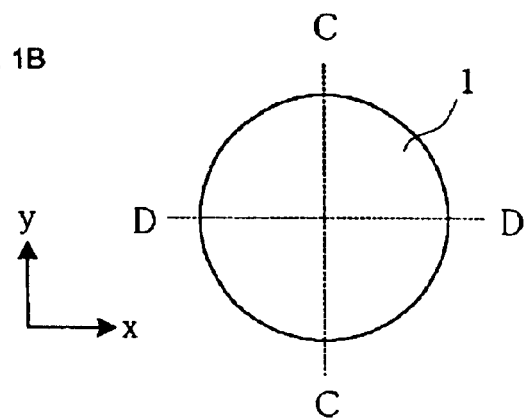
FIG. 1B is a top view of the dielectric resonator in FIG. 1A.
Figure 1C:
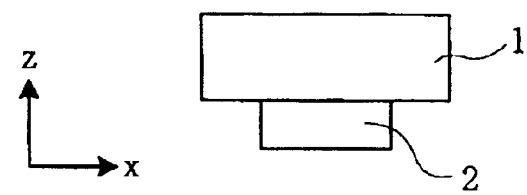
FIG. 1C is a side view of the dielectric resonator in FIG. 1A.

FIG. 1A is a perspective view of a dielectric resonator. FIG. 1B is a top view of the dielectric resonator. FIG. 1C is a side view of the dielectric resonator. Referring to FIGS. 1A to 1C, the dielectric resonator has a circular dielectric resonant element 1 and a support 2 for supporting the dielectric resonant element 1 at a predetermined height from a substrate.

FIGS. 2A to 2E show electric field vectors and magnetic field vectors of the dielectric resonant element 1 in FIGS. 1A to 1C in various resonant modes, viewed from the top of the dielectric resonant element. Arrows indicated by solid lines denote the electric field vectors and arrows indicated by broken lines denote the magnetic field vectors. The thickness direction of the circular dielectric resonant element 1 (the direction of the axis of rotation symmetry) is represented as the z axis and two orthogonal axes that are perpendicular to the z axis are represented as the x axis and the y axis.

FIG. 2A shows a TE01δ (z) mode in which the electric field vector circles around the z axis. A toroidal magnetic field is generated around the electric field vector. FIG. 2B shows a TM01δ (x) mode in which the magnetic field vector circles in a plane normal to the x axis. FIG. 2C shows a TM01δ (y) mode in which the magnetic field vector circles in a plane normal to the y axis. FIG. 2D shows a TE01δ (x) mode in which the electric field vector circles in a plane normal to the x axis. FIG. 2E shows a TE01δ (y) mode in which the electric field vector circles in a plane normal to the y axis.

The two magnetic fields in the TE01δ (z) mode and in the TM01δ (y) mode, which are magnetically coupled to lines on the substrate on which the dielectric resonator in FIGS. 1A to 1C is placed, are used in this first embodiment.

Selective use of a desired resonant mode among a plurality of resonant modes will now be described.

Since the circular dielectric resonant element 1 in FIG. 1A to 2E is symmetric along a C—C cross section or along a D—D cross section shown in FIG. 1B, the resonant frequency in the TM01δ (x) mode is equal to the resonant frequency in the TM01δ (y) mode. However, the magnetic field vector in the TM01δ (x) mode is orthogonal to, and is not coupled to, the magnetic field vector in the TM01δ (y) mode. Hence, a line that is coupled to the magnetic field in the TM01δ (x) mode is not coupled to the magnetic field in the TM01δ (y) mode, thus selectively achieving the coupling to the magnetic field in the TM01δ (x) mode. Accordingly, as described below, the magnetic fields in the TE01δ (z) mode and in the TM01δ (y) mode can be coupled to the corresponding lines in two oscillation circuits.

Figure 3:
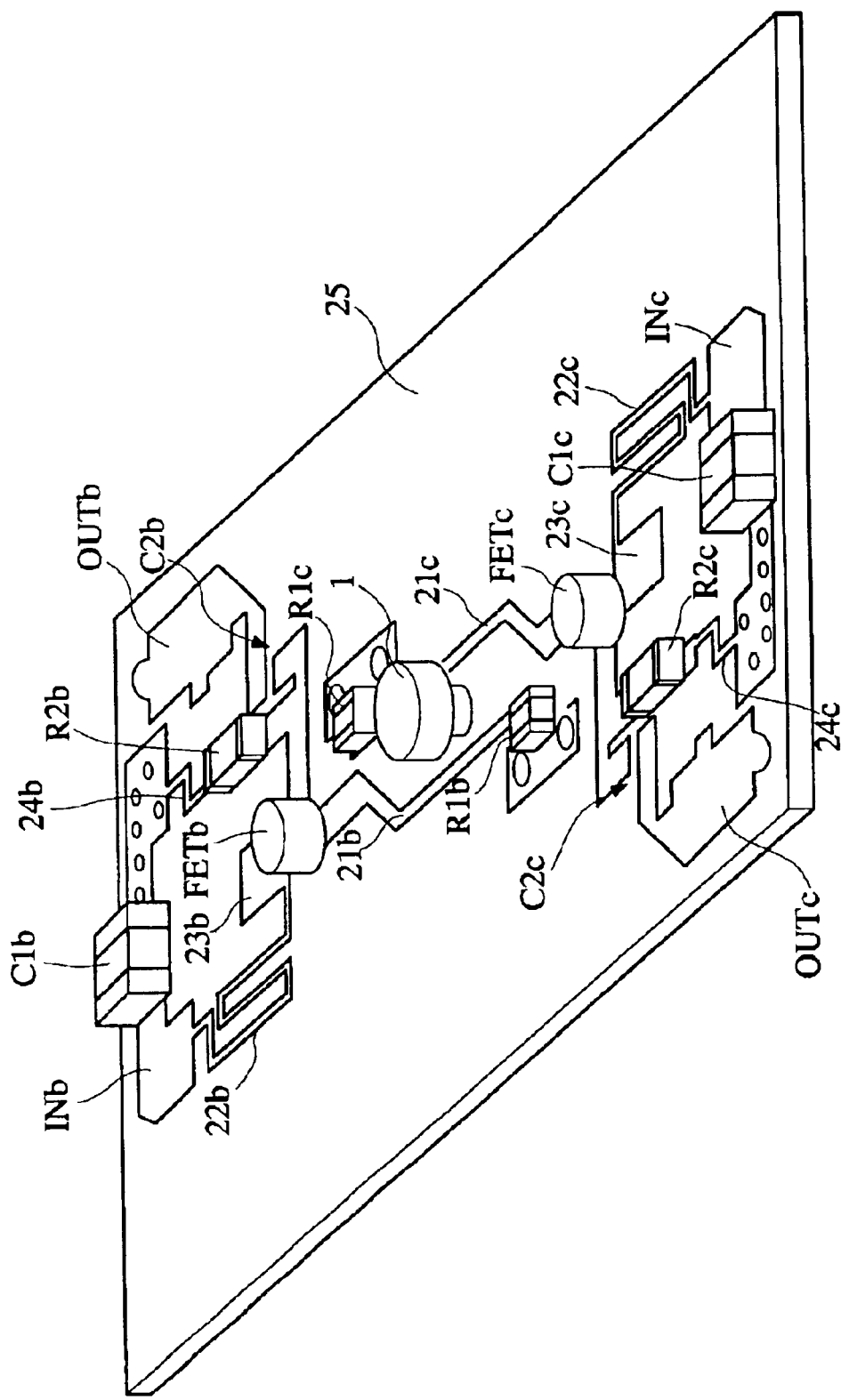
FIG. 3 is a perspective view showing the structure of the oscillation apparatus.

FIG. 3 is an external perspective view of the oscillation apparatus using the dielectric resonant element shown in FIGS. 1A to 2E. Lines (microstrip lines) 21b to 24b and lines (microstrip lines) 21c to 24c are placed on a substrate 25. Capacitors C2b, C2c are formed on the substrate 25. Field effect transistors FETb and FETc, chip resistors R1b, R2b, R1c, and R2c, and chip capacitors C1b and C1c are mounted on the substrate 25. The dielectric resonant element 1 is mounted on the substrate 25 with the support 2 provided therebetween.

Figure 4:
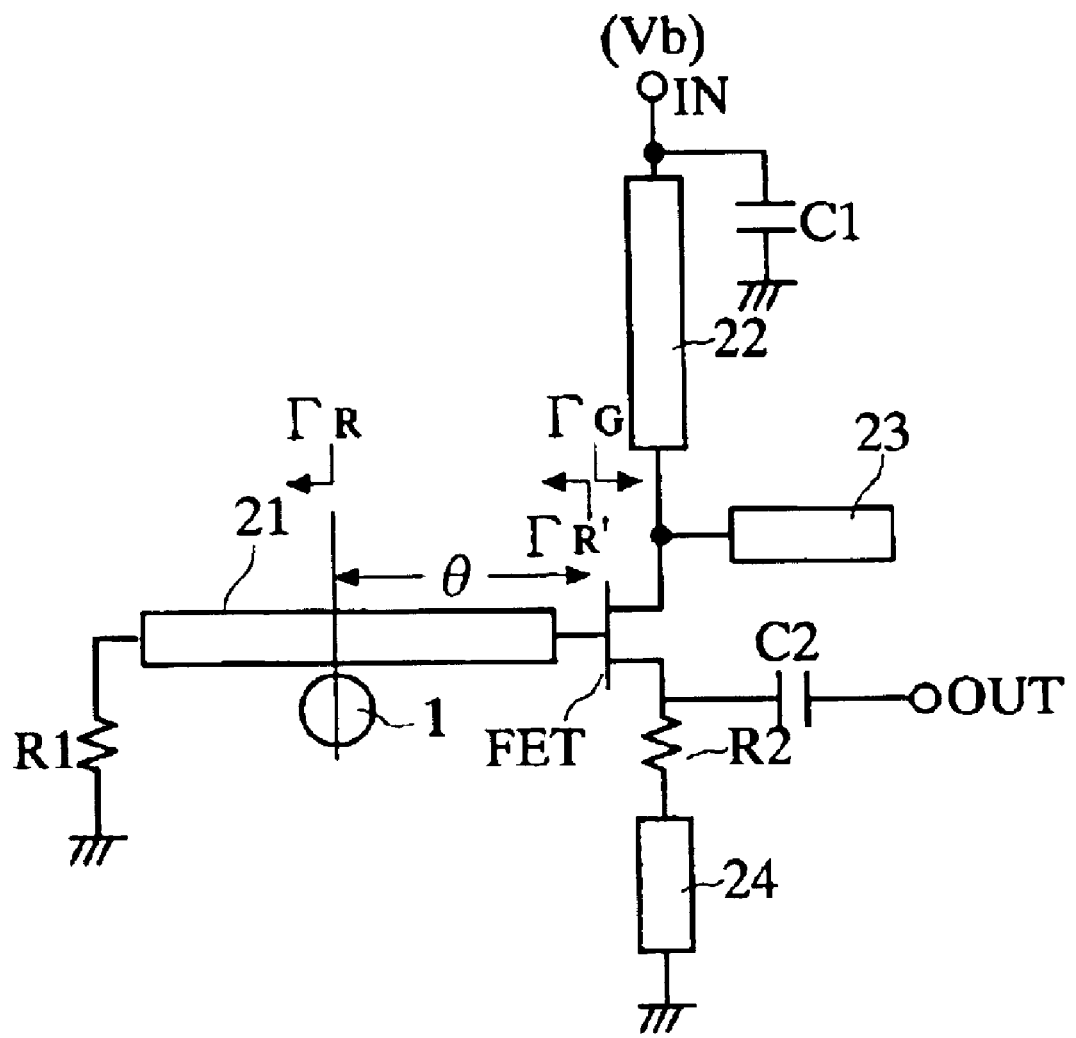
FIG. 4 is an equivalent circuit diagram of one oscillator in the oscillation apparatus shown in FIG. 3.

FIG. 4 is an equivalent circuit diagram of one oscillator in the oscillation apparatus shown in FIG. 3. The same reference numerals in FIG. 3 are used to identify the same elements shown in FIG. 4. One end of a line 21 is connected to a resistor R1 and the other end of the line 21 is connected to the gate of an FET. A bias voltage circuit including a line 22 and a capacitor C1 is connected to the drain of the FET. A bias voltage is denoted by Vb. The source of the FET is grounded through a resistor R2 and a line 24. A stub line 23 is also connected to the drain of the FET. Oscillation signals are output from the source of the FET through a capacitor C2.

The dielectric resonant element 1 is coupled to a predetermined position in the line 21. All of the above components constitute a band-reflection oscillation circuit.

The oscillation apparatus shown in FIG. 3 has two of the oscillators in FIG. 4. The single dielectric resonant element 1 is mounted on the substrate 25 and the two oscillation circuits are symmetric with respect to a point where the dielectric resonant element 1 is mounted. In other words, the dielectric resonant element 1 serves as a dielectric resonator for both the TE01δ (z) mode and the TM01δ (y) mode, which differ in resonant frequency. The magnetic fields of the TE01δ (z) mode and the TM01δ (y) mode are coupled to the lines 21b and 21c, respectively. As a result, the oscillation apparatus serves as a dual-band oscillation apparatus for outputting two kinds of oscillation signals that differ in frequency with each other, with a single dielectric resonant element.

Placing two oscillation circuits symmetrically with respect to the dielectric resonant element 1 allows the two oscillation circuits to be provided on the substrate 25 having a limited area, thus significantly reducing in size of the overall oscillation apparatus. Since two dielectric resonant elements for the two oscillation circuits are not provided on the substrate 25, the arrangement or the shielding for avoiding the coupling between the dielectric resonant elements is not required and therefore the oscillation apparatus can be reduced in size.

A reflection coefficient ΓR in FIG. 4 at a position where the dielectric resonant element 1 is placed is given by the following equation:

$$\Gamma R = \kappa/(1+\kappa+j2Qu\delta) \quad (1)$$

where κ denotes a coupling coefficient between the dielectric resonant element 1 and the line 21 and Qu denotes an unloaded Q factor of the dielectric resonant element 1 mounted on the substrate 25. Theta (δ) in the equation (1) denotes a relative shift of an oscillation frequency f of the oscillator with respect to a resonant frequency fo of the dielectric resonant element 1, which is given by the following equation:

$$\delta = (f-fo)/fo \quad (2)$$

A reflection coefficient ΓR' of the line 21, viewed from the gate of the FET, is expressed by the following equation using equation (1):

$$\Gamma R' = \Gamma R \exp(-2\theta) \quad (3)$$

where θ denotes an electrical length from the gate of the FET to the dielectric resonant element 1. The oscillation state of a negative resistance oscillator is given by the following equation:

$$\Gamma R \Gamma G = 1 \quad (4)$$

where ΓG is the reflection coefficient of the FET, viewed from the gate thereof.

In other words, when the dielectric resonant element 1 having the resonant frequency fo is placed at a position θ that satisfies the relationship shown by equation (4), the oscillator generates the oscillation frequency f.

For example, in order to realize an oscillator having the oscillation frequency f, the dielectric resonant element 1 that has the resonant frequency fo in the TE01δ mode is placed at the position θ. At this time, the dielectric resonant element 1 can oscillate in other resonant modes. However, if the resonant frequencies in the other resonant modes are set to values other than fo, equation (4) is not satisfied even when the magnetic fields in the other resonant modes are coupled to the line 21, and therefore the other resonant modes described above do not have an impact on the oscillator having the oscillation frequency f. In this manner, selective use of a desired resonant mode can be achieved. For example, the TE01δ mode is used for an oscillator having an oscillation frequency of 10.678 GHz and the TM01δ (y) mode is used for an oscillator having an oscillation frequency of 11.200 GHz.

A dielectric resonant element used in an oscillation apparatus according to a second embodiment of the present invention will now be described with reference to FIGS. 5A to 5D.

Deformation in manufacturing, variation in size, and so on of the dielectric resonant element 1 in FIGS. 1A to 1C cause the difference in resonant frequency between the TM01δ (x) mode and the TM01δ (y) mode. Since the TM01δ (y) mode is used as the resonant mode in this embodiment, the resonant frequency in the TM01δ (x) mode has no relation. However, some components in the magnetic field vector in the TM01δ (x) mode are perpendicular to the lines 21b and 21c, so that the magnetic field in the TM01δ (x) mode is partially coupled to the lines 21b and 21c. There is no problem if the resonant frequency in the TM01δ (x) mode is equal to that in the TM01δ (y) mode. However, if the resonant frequency in the TM01δ (x) mode slightly differs from that in the TM01δ (y) mode, two resonators having different resonant frequencies are coupled to the lines 21b and 21c, thus possibly outputting the oscillation signals on which unnecessary frequency components are superimposed.

Consequently, predetermined areas in the dielectric resonant element 1 are cut out such that the resonant frequency in the TM01δ (x) mode that is not used is largely shifted from the resonant frequency in the TM01δ (y) mode that is used. For example, the resonant frequency in the TM01δ (y) mode is made higher than the resonant frequency in the TM01δ (x) mode by cutting off areas where the electric field components in the TM01δ (y) mode are concentrated on in the dielectric resonant element 1.

Figure 5D:
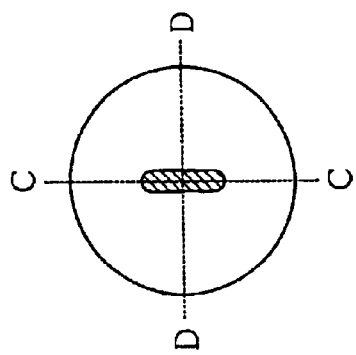
FIGS. 5A to 5D show structures of a dielectric resonant element used in an oscillation apparatus according to a second embodiment of the present invention.
Figure 5C:
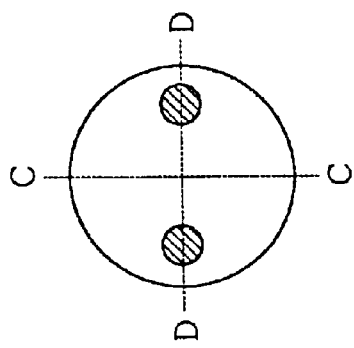
Figure 5B:
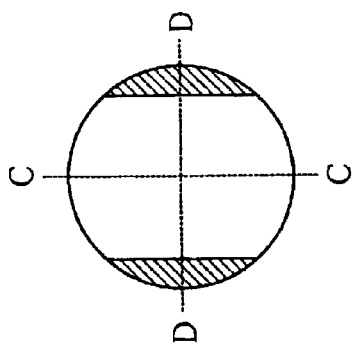
Figure 5A:
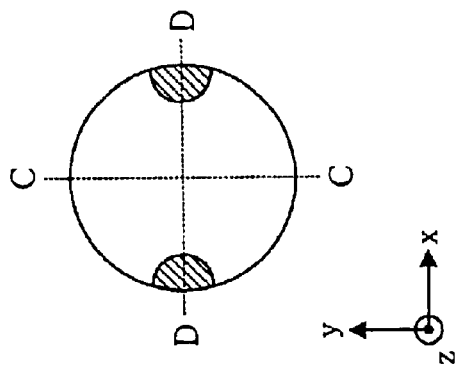

FIGS. 5A to 5D show examples of the cut-out areas. Referring to FIGS. 5A to 5D, hatched areas denote the areas cut out. FIG. 5A shows an example where notches are provided symmetrically with a plane C—C. FIG. 5B shows an example where two parts at both ends are cut out symmetrically with the plane C—C. FIG. 5C shows an example where two holes or through holes are cut out symmetrically with the plane C—C. FIG. 5D shows an example where a long hole is cut out along the plane C—C at an area where the electric field components in the TM01δ (y) mode are concentrated on.

With either structure, the resonant frequency in the TM01δ (y) mode is increased almost without varying the resonant frequency in the TM01δ (x) mode. Although the dielectric resonant element 1 may really be cut out, a dielectric resonant element having the cut-out areas may be molded in advance.

Conversely, in order to shift the resonant frequency in the TM01δ (x) mode that is not used to a bandwidth higher than the resonant frequency in the TM01δ (y) mode that is used, areas where the electric field components in the TM01δ (x) mode are concentrated on are cut out symmetrically with a plane D—D.

Although the above description is a case in which the resonant frequency in the TM01δ (x) mode largely differs from the resonant frequency in the TM01δ (y) mode, coupling the magnetic field in the TM01δ (x) mode to the lines causes no problem if the resonant frequencies in the two modes coincide with each other.

When the resonant frequency in the TM01δ (y) mode is lower than that in the TM01δ (x) mode, cutting off part of the dielectric resonant element 1 symmetrically with the plane C—C at an area where the electric field components in the TM01δ (y) mode are concentrated on, as shown in FIGS. 5A to 5D, causes the resonant frequency in the TM01δ (y) mode to coincide with the resonant frequency in the TM01δ (x) mode.

Conversely, when the resonant frequency in the TM01δ (x) mode is lower than the resonant frequency in the TM01δ (y) mode, cutting off part of the dielectric resonant element 1 symmetrically with the plane D—D at an area where the electric field components in the TM01δ (x) mode are concentrated on causes the resonant frequency in the TM01δ (x) mode to coincide with the resonant frequency in the TM01δ (y) mode.

An oscillation apparatus according to a third embodiment of the present invention will now be described with reference to FIGS. 6A to 8B.

Figure 6A:
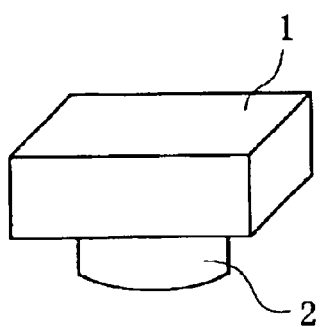
FIG. 6A is a perspective view of a dielectric resonator used in an oscillation apparatus according to a third embodiment of the present invention.
Figure 6B:
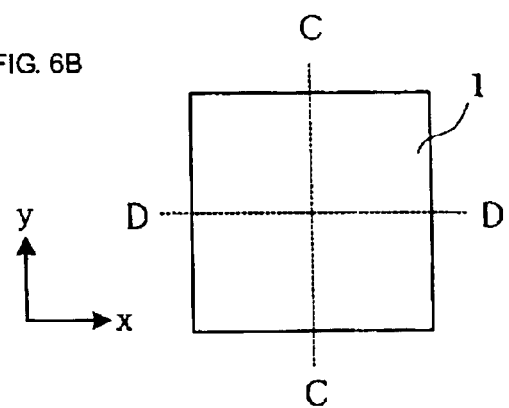
FIG. 6B is a top view of the dielectric resonator in FIG. 6A.
Figure 6C:
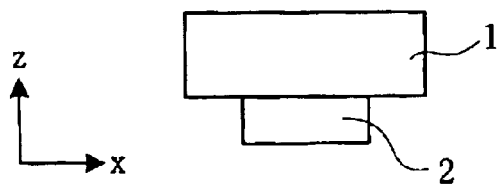
FIG. 6C is a side view of the dielectric resonator in FIG. 6A.

FIG. 6A is a perspective view of a dielectric resonator. FIG. 6B is a top view of the dielectric resonator. FIG. 6C is a side view of the dielectric resonator. Referring to FIGS. 6A to 6C, the dielectric resonator has a square-plate dielectric resonant element 1 and a support 2 for supporting the dielectric resonant element 1 at a predetermined height from a substrate.

FIGS. 7A to 7E show various resonant modes occurring in the dielectric resonant element 1 of the dielectric resonator in FIGS. 6A to 6C. FIG. 7A shows a TE01δ (z) mode in which the electric field vector circles around the z axis. FIG. 7B shows a TM01δ (x) mode in which the magnetic field vector circles in a plane normal to the x axis. FIG. 7C shows a TM01δ (y) mode in which the magnetic field vector circles in a plane normal to the y axis. The TM01δ (x) mode and the TM01δ (y) mode are altered into modes shown in FIGS. 7D and 7E dependent on the direction of the placed dielectric resonant element 1. The magnetic fields in the TE01δ (x) mode and in the TE01δ (y) mode in FIGS. 2D and 2E are also generated, although those modes are not shown in FIGS. 7A to 7E.

Figure 8A:
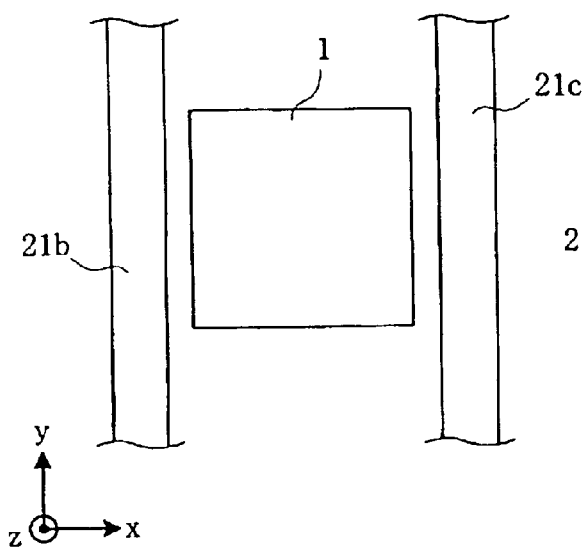
FIGS. 8A and 8B show exemplary arrangements of the dielectric resonators in FIGS. 6A to 6C.
Figure 8B:
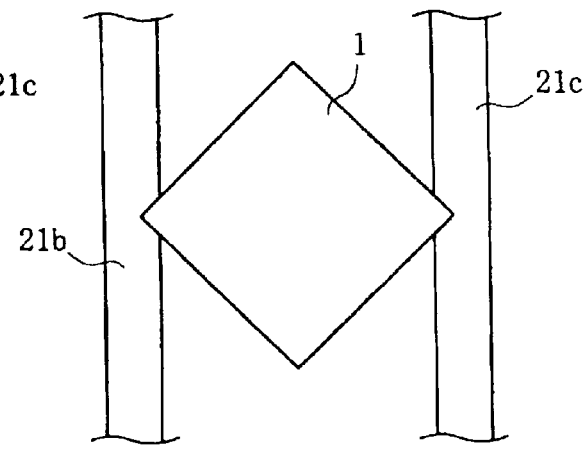

FIGS. 8A and 8B show exemplary arrangements of the dielectric resonant element 1 according to the third embodiment. In the dielectric resonator having the square-plate dielectric resonant element 1 placed on the substrate 25, as in FIG. 3, placing two sides of the square opposing each other in parallel to lines 21b and 21c as shown in FIG. 8A causes the magnetic field in the TM01δ (y) mode in FIG. 7C to be coupled to the line 21b or 21c. Also, placing four sides of the dielectric resonant element 1 at an angle of 45° with respect to the lines 21b and 21c, as shown in FIG. 8B, causes the magnetic field in the TM01δ (y) mode in FIG. 7E to be coupled to the line 21b or 21c.

A dielectric resonant element used in an oscillation apparatus according to a fourth embodiment of the present invention will now be described with reference to FIGS. 9A to 10D.

The magnetic field in the TM01δ (x) mode that is not used is partially coupled to the lines even when the square-plate dielectric resonant element 1 in FIGS. 6A to 6C is used. Hence, cutting off part of the dielectric resonant element 1, as in the second embodiment, causes the resonant frequency in the TM01δ (x) mode to be different from the resonant frequency in the TM01δ (y) mode. This is done so as to shift the resonant frequency in the TM01δ (y) mode that is used from the resonant frequency in the TM01δ (x) mode that is not necessary or in order to coincide with the resonant frequencies in the TM01δ (x) mode and the TM01δ (y) mode.

FIGS. 9A to 10D show the structures of the dielectric resonant element 1 used in the oscillation apparatus according to the fourth embodiment.

Figure 9D:
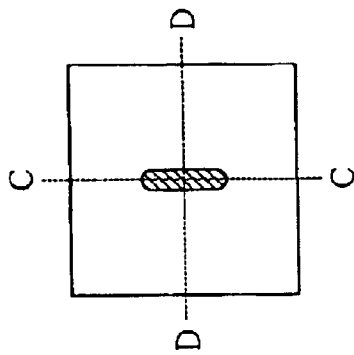
FIGS. 9A to 9D show structures of a dielectric resonant element used in an oscillation apparatus according to a fourth embodiment of the present invention.
Figure 9C:
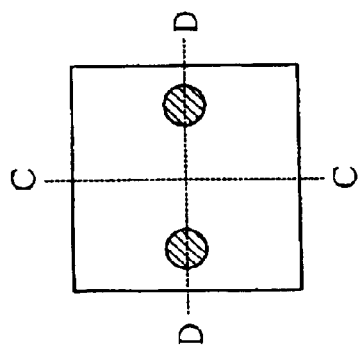
Figure 9B:
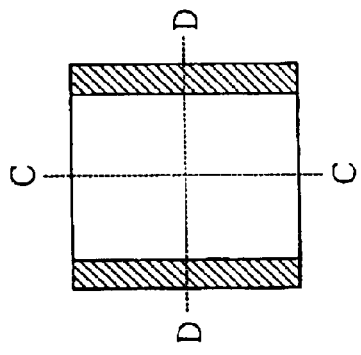
Figure 9A:
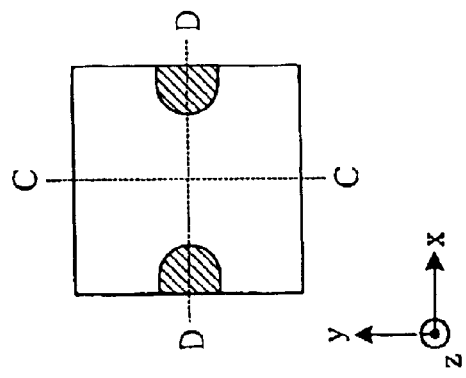
Figure 10D:
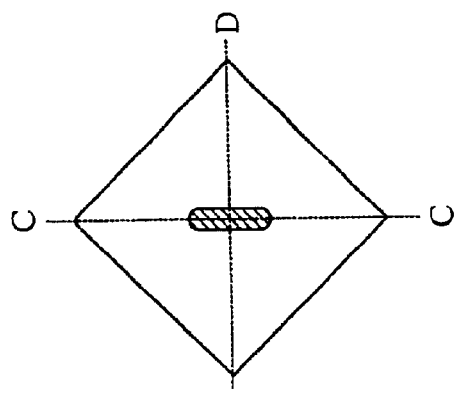
FIGS. 10A to 10D show other structures of the dielectric resonant element used in the oscillation apparatus according to the fourth embodiment.
Figure 10C:
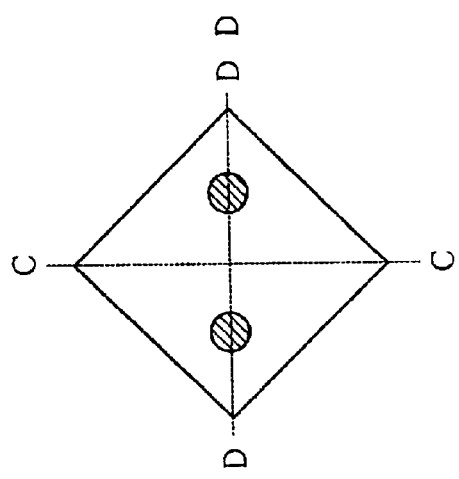
Figure 10B:
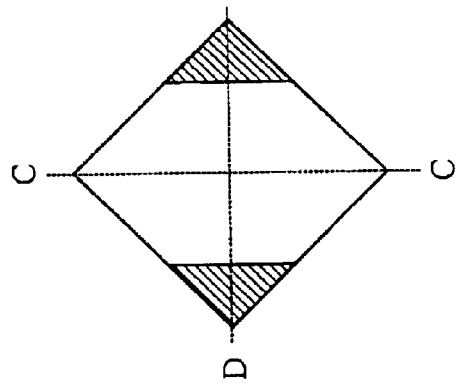
Figure 10A:
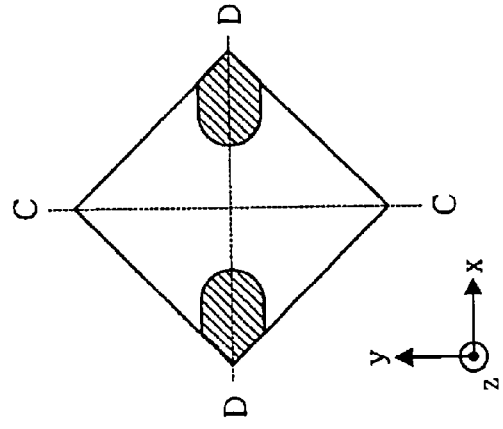

FIGS. 9A to 9D show the structures of the dielectric resonant element 1 placed as in FIG. 8A. FIGS. 10A to 10D show the structures of the dielectric resonant element 1 placed as in FIG. 8B. FIGS. 9A and 10A show examples where notches are provided symmetrically with a plane C—C. FIG. 9B shows an example where two parts along both sides are cut out symmetrically with the plane C—C and FIG. 10B shows an example where two parts along two opposite ends are cut out symmetrically with the plane C—C. FIGS. 9C and 10C show examples where two holes or through holes are cut out symmetrically with the plane C—C. FIGS. 9D and 10D show examples where a long hole is cut out along the plane C—C at an area where the electric field components in the TM01δ (y) mode are concentrated.

With either structure, the resonant frequency in the TM01δ (y) mode is increased almost without varying the resonant frequency in the TM01δ (x) mode. Although the dielectric resonant element 1 may really be cut out, a dielectric resonant element having the cut-out areas may be molded in advance.

An oscillation apparatus according to a fifth embodiment of the present invention will now be described with reference to FIGS. 11A and 11B.

Figure 11A:
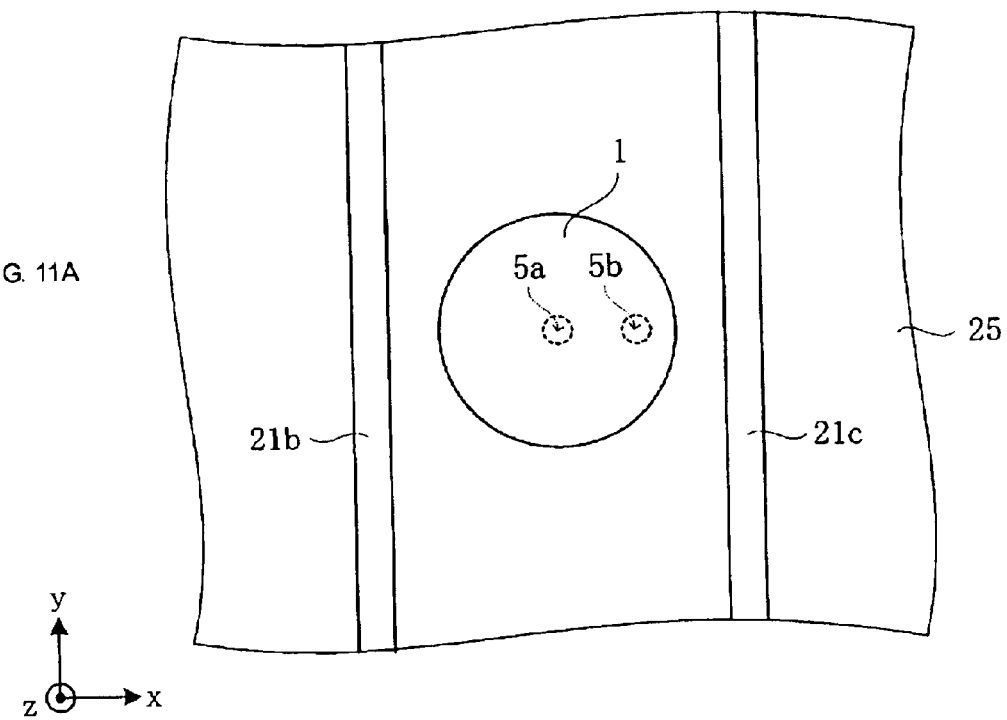
FIGS. 11A and 11B show the structure of the main part of an oscillation apparatus according to a fifth embodiment of the present invention.
Figure 11B:
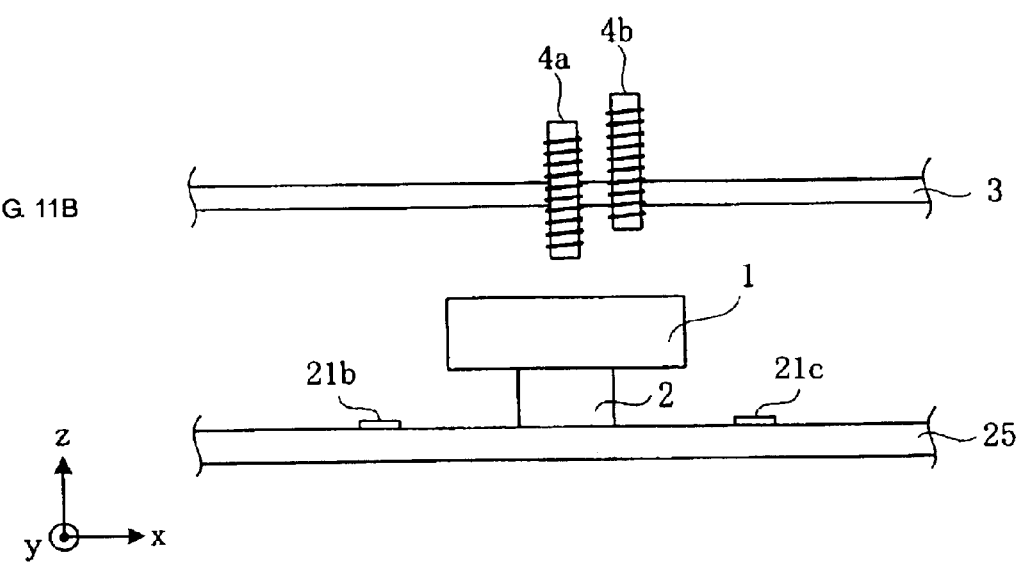

FIG. 11A is a top view of the main part of the oscillation apparatus. FIG. 11B is a side view partially showing the oscillation apparatus when the overall oscillation apparatus is covered with a metallic case 3. The case 3 covers over the substrate 25. The oscillation apparatus has adjustment screw holes 5a and 5b provided in the case 3 and metallic adjustment screws 4a and 4b screwed into the adjustment screw holes 5a and 5b, respectively. The adjustment screw hole 5a is provided such that the adjustment screw 4a moves up and down along the central axis (the axis of rotation symmetry) of the dielectric resonant element 1. The adjustment screw hole 5b is provided such that the adjustment screw 4b moves up and down at a position where the adjustment screw 4b intersects the electric fields in the TM01δ (y) mode and in the TE01δ (z) mode.

As the adjustment screw 4b is deeply screwed into the adjustment screw hole 5b in this state, the resonant frequencies in the TM01δ (y) mode and in the TE01δ (z) mode increase. As the adjustment screw 4a is deeply screwed into the adjustment screw hole 5a, the resonant frequency in the TM01δ (y) mode increases while the resonant frequency in the TE01δ (z) mode almost remains the same. Accordingly, screwing and removing the two adjustment screws 4a and 4b into and from the adjustment screw holes 5a and 5b allow the resonant frequencies in the two resonant modes to be set to predetermined values. That is, the oscillation frequency characteristics of the two oscillators can be adjusted. Hence, the resonant frequencies of the dielectric resonant element 1 in the two resonant modes can be adjusted after the dielectric resonant element 1 is mounted, even when variations in manufacturing of the dielectric resonant element 1 occur or even when the resonant frequency in the used resonant mode shifts from a standard value owing to the influence of the peripheral structure with the dielectric resonant element 1 being mounted on the substrate 25.

The structure of a communication apparatus and, in particular, of a converter according to a sixth embodiment of the present invention will now be described with reference to FIG. 12.

Figure 12:
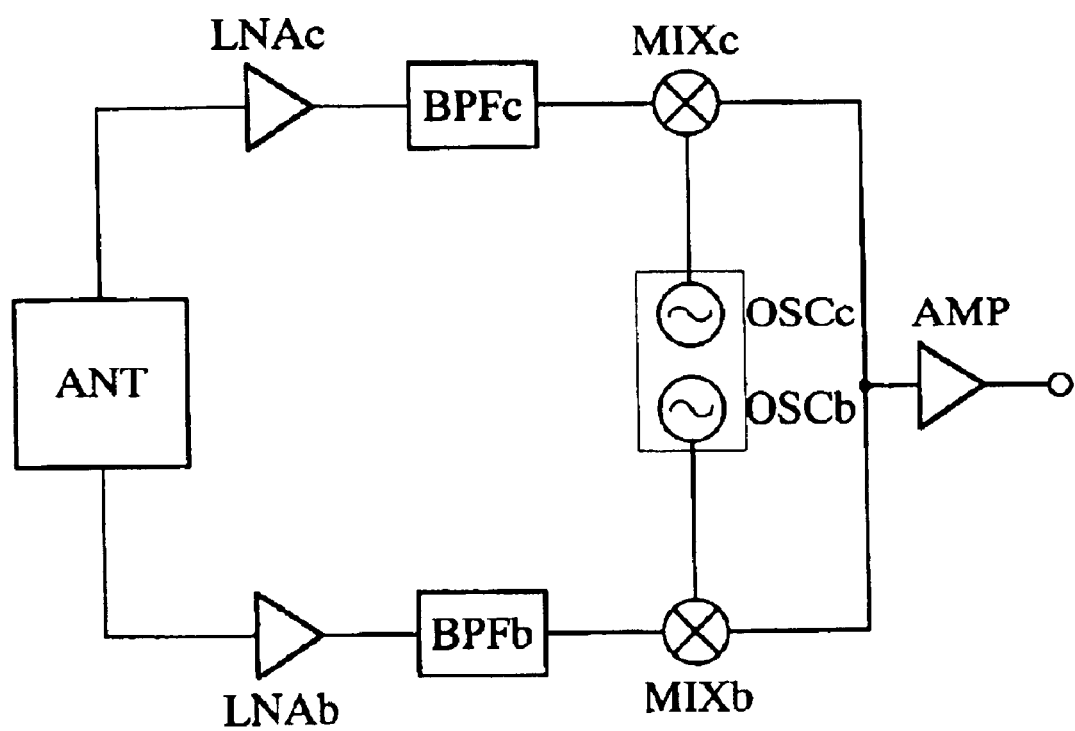
FIG. 12 is a block diagram showing the structure of a communication apparatus according to a sixth embodiment of the present invention.

The converter in FIG. 12 receives electromagnetic waves transmitted from a broadcast satellite (BS) or a communication satellite (CS) to convert the received waves into intermediate-frequency signals. Referring to FIG. 12, the converter has a receiver probe ANT for an antenna used for both the BS and the CS, a low-noise amplifier LNAb for amplifying the BS signals received from the receiver probe ANT and a low-noise amplifier LNAc for amplifying the CS signals received from the receiver probe ANT, and band pass filters BPFb and BPFc for passing only signals within a required frequency band among the signals amplified by the respective low-noise amplifiers LNAb and LNAc.

The converter also has oscillators OSCb and OSCc according to either embodiment of the present invention. The oscillator OSCb generates local signals for the BS and the oscillator OSCc generates local signals for the CS. The oscillators OSCb and OSCc constitute a single oscillation apparatus.

The converter further has mixers MIXb and MIXc for mixing the local signals and the received signals to output the intermediate-frequency signals for the BS and the CS, respectively, and an amplifier AMP for amplifying the intermediate-frequency signals to output the amplified signals to a downstream receiver circuit.

The oscillation apparatuses according to the embodiments described above use the two resonant modes, that is, the TE01δ (z) mode and the TM01δ (y) mode, to output two kinds of oscillation signals having different frequencies. However, oscillation circuits including lines that are coupled to the corresponding magnetic fields of more than two resonant modes can be used to constitute an oscillation apparatus for outputting more than two kinds of oscillation signals having different frequencies.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An oscillation apparatus comprising:

a multi-mode dielectric resonant element;

a plurality of oscillation circuits, each oscillation circuit including a line coupled to the dielectric resonant element and active devices connected to ends of the line; and a substrate having the lines and the active devices provided thereon, the dielectric resonant element being placed on the substrate, wherein magnetic fields, occurring in the dielectric resonant element, in a plurality of resonant modes having different resonant frequencies are coupled to the corresponding lines in the plurality of oscillation circuits.

2. An oscillation apparatus according to claim 1, wherein the plurality of oscillation circuits is two oscillation circuits, wherein a line of one oscillation circuit is placed substantially in parallel to a line of the other oscillation circuit, wherein the multi-mode dielectric resonant element is placed between said line of one oscillation circuit and said line of the other oscillation circuit, and wherein magnetic fields in two resonant modes of the dielectric resonant element are coupled to the corresponding lines.

3. An oscillation apparatus according to claim 2, wherein the two resonant modes are a TM01$\delta$ mode and a TE01$\delta$ mode.

4. An oscillation apparatus according to claim 1, wherein the dielectric resonant element is a substantially circular dielectric plate.

5. An oscillation apparatus according to claim 1, wherein the dielectric resonant element is a substantially square dielectric plate.

6. An oscillation apparatus according to claim 1, wherein the dielectric element includes at least one cut-out area.

7. An oscillation apparatus according to claim 6, wherein there are two cut-out areas provided symmetrically relative to a plane through the dielectric element.

8. An oscillation apparatus according to claim 7, wherein the cut-out areas are holes in the dielectric element.

9. An oscillation apparatus according to claim 6, wherein the at least one cut-out area is provided along a plane through the dielectric element.

10. An oscillation apparatus according to claim 1, wherein the dielectric element includes a support for supporting the dielectric element at a predetermined height from the substrate.

11. An oscillation apparatus according to claim 5, wherein two sides of the square dielectric plate are parallel to the lines.

12. An oscillation apparatus according to claim 5, wherein sides of the square dielectric plate are at an angle with respect to the lines.

13. An oscillation apparatus according to claim 12, wherein the angle is 45 degrees.

14. A communication apparatus comprising the oscillation apparatus according to claim 1.

* * * * *